(12) United States Patent
Li

(10) Patent No.: US 12,074,075 B2
(45) Date of Patent: Aug. 27, 2024

(54) DATA ANALYSIS METHOD, ELECTRONIC DEVICE, AND STORAGE MEDIUM FOR GRAPHICAL ANALYSIS OF WAFER YIELD

(71) Applicant: CHANGXIN MEMORY TECHNOLOGIES, INC., Hefei (CN)

(72) Inventor: Yukun Li, Hefei (CN)

(73) Assignee: CHANGXIN MEMORY TECHNOLOGIES, INC., Hefel (CN)

( * ) Notice: Subject to any disclaimer, the term of this patent is extended or adjusted under 35 U.S.C. 154(b) by 341 days.

(21) Appl. No.: 17/447,410

(22) Filed: Sep. 10, 2021

(65) Prior Publication Data

US 2022/0077005 A1  Mar. 10, 2022

Related U.S. Application Data

(63) Continuation of application No. PCT/CN2021/100431, filed on Jun. 16, 2021.

(30) Foreign Application Priority Data

Sep. 9, 2020 (CN) .......................... 202010938941.5

(51) Int. Cl.
*H01L 21/66* (2006.01)
*G06F 16/901* (2019.01)
(Continued)

(52) U.S. Cl.
CPC .......... *H01L 22/20* (2013.01); *G06F 16/9024* (2019.01); *G06F 17/15* (2013.01); *G06F 17/18* (2013.01); *G06F 18/2193* (2023.01); *G06Q 10/04* (2013.01); *H01L 22/12* (2013.01); *H01L 22/14* (2013.01)

(58) Field of Classification Search
CPC .... G06F 30/398; G06F 17/10; G06F 2119/22; G06F 11/3452; G06F 16/9024; G06F 17/15; G06F 17/18; G06F 18/2193; G01R 31/26; G01R 31/2831; G05B 2219/45031; G05B 2219/37205; G05B 19/41875;
(Continued)

(56) References Cited

U.S. PATENT DOCUMENTS 5,234,298 A * 8/1993 Shuker ................. B61D 45/001
                                                  410/98
5,761,064 A * 6/1998 La ........................... H01L 22/20
                                                  700/110
(Continued)

*Primary Examiner* — Darrin D Dunn
(74) *Attorney, Agent, or Firm* — Syncoda LLC; Feng Ma

(57) ABSTRACT

A data analysis method includes: a target yield problem stacked graph corresponding to a wafer list is obtained, and measurement data stacked graphs of the wafer list under different types of tests are obtained; graph matching is performed on the target yield problem stacked graph and each of the measurement data stacked graphs to obtain matching degree data corresponding to the target yield problem stacked graph and each of the measurement data stacked graphs; correlation data corresponding to each of the measurement data stacked graphs and the target yield problem stacked graph is calculated; and weighted calculation is performed on the matching degree data and the correlation data, and a target measurement parameter causing a target yield problem is determined according to a result of the weighted calculation.

17 Claims, 6 Drawing Sheets

(51) Int. Cl.
 *G06F 17/15* (2006.01)
 *G06F 17/18* (2006.01)
 *G06F 18/21* (2023.01)
 *G06Q 10/04* (2023.01)
(58) Field of Classification Search
 CPC ........... G05B 2219/31477; G05B 2219/32221; G05B 19/41845; G05B 19/41865
 See application file for complete search history.

(56) References Cited

U.S. PATENT DOCUMENTS

| | | | | |
|---|---|---|---|---|
| 6,210,983 B1 * | 4/2001 | Atchison | ................. | H01L 22/20 700/121 |
| 6,556,949 B1 * | 4/2003 | Lyon | ................ | G05B 19/41875 702/182 |
| 6,717,431 B2 * | 4/2004 | Rathei | .................... | H01L 22/20 702/81 |
| 7,026,175 B2 * | 4/2006 | Li | ........................... | H01L 22/12 438/16 |
| 7,198,964 B1 * | 4/2007 | Cherry | ................... | H01L 22/20 257/E21.531 |
| 7,385,605 B2 * | 6/2008 | Twait | .................... | G06T 11/206 345/440 |
| 7,630,858 B1 * | 12/2009 | Weiher-Telford | ........................... | G05B 19/41875 702/179 |
| 8,935,198 B1 * | 1/2015 | Phillips | .................. | G06Q 40/00 706/62 |
| 10,268,562 B1 * | 4/2019 | Stine | ................... | G06F 11/3452 |
| 10,692,161 B2 * | 6/2020 | Saratsis | ............... | G06Q 50/163 |
| 11,501,116 B1 * | 11/2022 | Kakde | .................... | G06N 20/00 |
| 11,630,973 B2 * | 4/2023 | Kakde | ................ | G06F 18/2193 706/12 |
| 2006/0101355 A1 * | 5/2006 | Ciplickas | ................ | G06F 30/30 716/132 |
| 2012/0227019 A1 * | 9/2012 | Culp | ...................... | G01R 31/26 716/56 |
| 2013/0173041 A1 * | 7/2013 | Leu | .................. | G06Q 10/06395 700/105 |
| 2022/0266414 A1 * | 8/2022 | Miki | ................... | B24B 37/013 |

* cited by examiner

| S610, Obtain target yield problem distribution graphs, each corresponding to a respective one of wafers in a wafer list |
|---|
| Obtain the input wafer list and the target yield problem distribution graphs (for example, LotA/waferB/LotC/LotD/waferE, and the like), each corresponding to a respective one of wafers in the wafer list |

| S620, Stack the target yield problem distribution graphs to obtain the target yield problem stacked graph, and stack the measurement data distribution graphs under the different types of tests to obtain the measurement data stacked graphs |
|---|
| target yield problem stacked graph 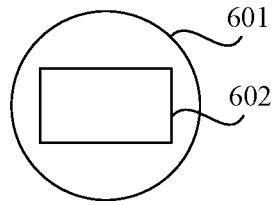 601 / 602 |

S630, Calculate the matching degree data and the correlation data

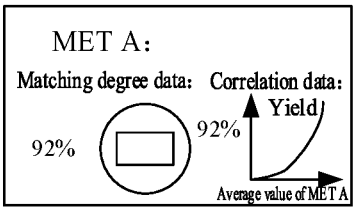
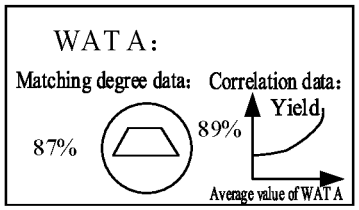
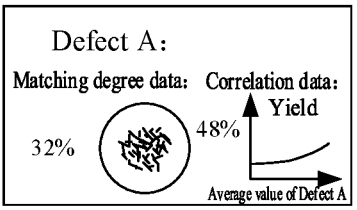

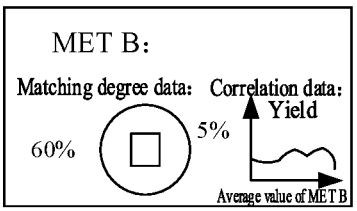
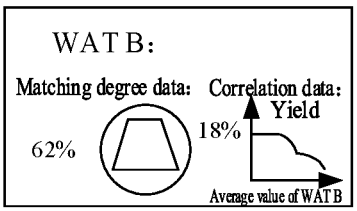
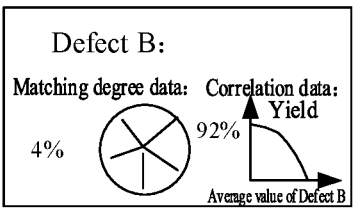

| MET C: | WAT C: | Defect C: |
| MET D: | WAT D: | Defect D: |
| ...... | ...... | ...... |

S640, Calculate weighted scores

| MET A: Weighted score: 85% | WAT A: Weighted score: 78% | Defect A: Weighted score: 12% |
|---|---|---|
| MET B: Weighted score: 21% | WAT B: Weighted score: 29% | Defect B: Weighted score: 2% |
| MET C: MET D: ...... | WAT C: WAT D: ...... | Defect C: Defect D: ...... |

FIG. 6

DATA ANALYSIS METHOD, ELECTRONIC DEVICE, AND STORAGE MEDIUM FOR GRAPHICAL ANALYSIS OF WAFER YIELD

CROSS-REFERENCE TO RELATED APPLICATIONS

This is a continuation of International Application No. PCT/CN2021/100431 filed on Jun. 16, 2021, which claims priority to Chinese Patent Application No. 202010938941.5 filed on Sep. 9, 2020. The disclosures of these applications are hereby incorporated by reference in their entirety.

BACKGROUND

With the rapid development of science and technology, as an electronic device which have a conductivity between that of a good conductor and that of an insulator, and can implement a specific function through utilization of a special electrical characteristic of semiconductor material, the semiconductor device attracts more and more concern and attention because it can be used to generate, control, receive, transform and amplify a signal and perform energy conversion.

It is to be noted that information disclosed in the above background section is only used to enhance understanding of the background of the disclosure, and thus may include information that does not constitute the conventional art known to those of ordinary skill in the art.

SUMMARY

The disclosure relates generally to the technical field of a semiconductor, and more specifically to a data analysis method, an electronic device, and a non-transitory computer readable storage medium.

An embodiment of the disclosure aims at providing a data analysis method, an electronic device, and a non-transitory computer readable storage medium.

According to a first aspect of the disclosure, a data analysis method is provided, including that: a target yield problem stacked graph corresponding to a wafer list having a target yield problem is obtained, and measurement data stacked graphs of the wafer list under different types of tests are obtained; graph matching is performed on the target yield problem stacked graph and each of the measurement data stacked graphs to obtain matching degree data corresponding to the target yield problem stacked graph and each of the measurement data stacked graphs; correlation data corresponding to each of the measurement data stacked graphs and the target yield problem stacked graph is calculated; and weighted calculation is performed on the matching degree data and the correlation data, and a target measurement parameter causing the target yield problem is determined according to a result of the weighted calculation.

According to a second aspect of the disclosure, an electronic device is provided, including: a processor; and a memory, computer-readable instructions are stored in the memory. When the computer-readable instructions are executed by the processor, the data analysis method of the first aspect is implemented.

According to a third aspect of the disclosure, a non-transitory computer-readable storage medium having a computer program stored thereon is provided. When the computer program is executed by a processor, the data analysis method of the first aspect is implemented.

It is to be understood that both the foregoing general description and the following detailed description are exemplary and explanatory only and cannot limit the disclosure.

BRIEF DESCRIPTION OF THE DRAWINGS

The accompanying drawings are incorporated in and constitute a part of the specification, illustrate embodiments consistent with the disclosure, and are used to explain the principle of the disclosure, together with the specification. Apparently, for those skilled in the art, the drawings in the following description are only some embodiments of the disclosure, and other drawings may also be obtained from these drawings without involving any inventive effort. In the drawings:

FIG. 6 schematically shows an application schematic diagram of determining a target measurement parameter according to one embodiment of the disclosure.

DETAILED DESCRIPTION

Figure 1:
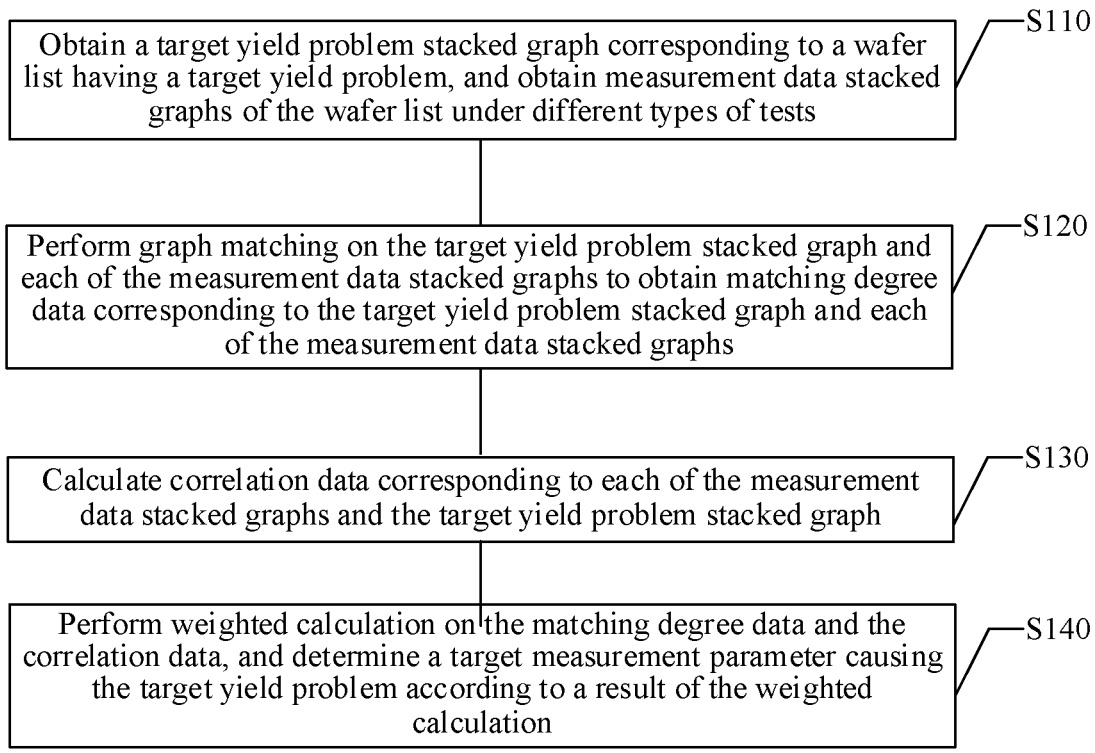
FIG. 1 schematically shows a flow chart of a data analysis method according to one embodiment of the disclosure.

Exemplary implementation modes will now be described more comprehensively with reference to the accompanying drawings. However, the exemplary implementation modes can be implemented in various forms and should not be construed as limited to the examples set forth herein; rather, these implementation modes are provided so that the disclosure will be thorough and complete, and will fully convey the concept of the exemplary implementation modes to those skilled in the art.

In addition, the described features, structures, or characteristics may be combined in one or more embodiments in any suitable mode. In the following description, a number of specific details are provided in order to provide a thorough understanding of the embodiment of the disclosure. However, it will be appreciated by those skilled in the art that the technical solution of the disclosure may be practiced without one or more of the specific details, or with other methods, elements, apparatuses, steps, and the like. In other cases, well-known methods, apparatuses, implementations, or operations are not shown or described in detail to avoid obscuring each aspect of the disclosure.

In addition, the drawings are only schematic illustrations and are not necessarily drawn to scale. The block diagrams shown in the drawings are only function entities and do not necessarily have to correspond to physically independent entities. That is, the function entities may be implemented in the form of software, or in one or more hardware modules or integrated circuits, or in different networks and/or processor apparatuses and/or microcontroller apparatuses.

A wafer refers to a silicon wafer used to manufacture a silicon semiconductor integrated circuit. The yield of a generated wafer fluctuates due to the influence of a process manufacturing procedure for processing the wafer. Therefore, a yield problem influencing the wafer yield needs to be analyzed, so that the process manufacturing procedure is adjusted according to a yield problem analysis result, and the yield of the wafer is improved.

When a process parameter causing the yield problem of the wafer is analyzed, a conclusion is generally obtained through manual analysis and comparison, but this solution result in a low analysis efficiency of the yield problem, a long analysis period, and a low accuracy rate of the analysis result obtained through the manual analysis.

In an exemplary embodiment, a data analysis method is provided first. The data analysis method may be applied to a terminal device or a server, and the exemplary embodiment does not impose a specific limitation on this. Hereinafter, the method executed by the server will be described as an example. FIG. 1 schematically shows a flow chart of a data analysis method according to some embodiments of the disclosure. Referring to FIG. 1, the data analysis method may include the following steps.

In S110, a target yield problem stacked graph corresponding to a wafer list having a target yield problem is obtained, and measurement data stacked graphs of the wafer list under different types of tests are obtained.

In S120, graph matching is performed on the target yield problem stacked graph and each of the measurement data stacked graphs to obtain matching degree data corresponding to the target yield problem stacked graph and each of the measurement data stacked graphs.

S130, correlation data corresponding to each of the measurement data stacked graphs and the target yield problem stacked graph is calculated.

S140, weighted calculation is performed on the matching degree data and the correlation data, and a target measurement parameter causing the target yield problem is determined according to result of the weighted calculation.

According to the data analysis method in the embodiment of the disclosure, on one hand, the graph matching is automatically performed on the target yield problem stacked graph and each of the measurement data stacked graphs, and the target measurement parameter causing the target yield problem of the wafer list is automatically determined according to the matching degree data obtained by the graph matching and the correlation data, manual analysis in a manual mode is not needed, and the analysis efficiency of the target measurement parameter causing the target yield problem is effectively improved. On the other hand, the target measurement parameter is determined by combining the matching degree data and the correlation data between the target yield problem stacked graph and each of the measurement data stacked graphs, so that the analysis efficiency can be improved, the accuracy of an analysis result is guaranteed, and the product quality is improved effectively.

Hereinafter, the data analysis method in the exemplary embodiment will be further described.

In S110, the target yield problem stacked graph corresponding to the wafer list having the target yield problem is obtained, and the measurement data stacked graph of the wafer list under different types of tests is obtained.

In one exemplary embodiment of the disclosure, the yield may be wafer yield. The wafer yield refers to the ratio of the number of chips tested to be qualified after all process steps are completed to valid chips on the entire wafer. The yield problem may be a problem in various process manufacturing procedures causing the fact that the wafer yield does not meet a standard yield requirement. For example, the yield problem may be caused by a defect, or may be caused by an electrical problem wafer acceptance testing (WAT) and may also be caused by a structural problem metrology (MET). Of course, there may be other problems in various process steps causing the fact that the wafer yield does not meet the standard yield requirement. The exemplary embodiment does not impose the specific limitation on this.

Specifically, a defect parameter corresponding to the defect problem may include one or more measurement parameters, for example, a line width parameter, a depth parameter, a film thickness parameter, a uniformity parameter, a height difference parameter, a bending degree parameter, and the like in each manufacturing procedure. An electrical parameter corresponding to the electrical problem may include one or more measurement parameters, for example, a turn-on current parameter, a leakage current parameter in various directions, a threshold voltage parameter, a breakdown voltage parameter, a capacitance parameter between structures, an inductance parameter, a resistance value parameter, and the like of various semiconductor elements. A structural parameter corresponding to the structural problem may include a structural anomaly parameter occurring in each manufacturing procedure. Of course, the parameter is only illustrative herein and the exemplary embodiment is not limited to this.

In one exemplary embodiment of the disclosure, S110 may include S210 and S220. The target yield problem stacked graph may be generated through S210 and S220.

Figure 2:
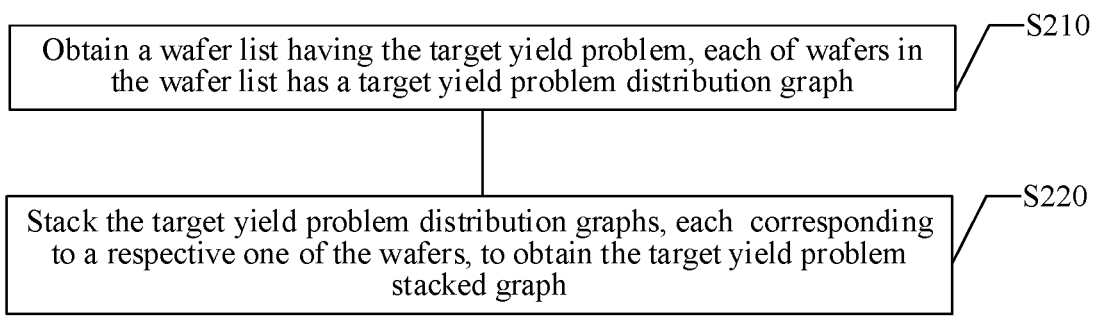
FIG. 2 schematically shows a flow chart of generating a target yield problem stacked graph according to one embodiment of the disclosure.

Referring to FIG. 2, S210, the wafer list having the target yield problem is obtained, each of wafers in the wafer list has a target yield problem distribution graph.

S220, the target yield problem distribution graphs, each corresponding to a respective one of the wafers, are stacked to obtain the target yield problem stacked graph.

A lot/wafer list may refer to a set of wafers with the same target yield problem. The wafer list may include the target yield problem distribution graphs of the wafers. The target yield problem distribution graph may be a feature graph which is instantly input by a user through an input interface, has the same target yield problem and contains various measurement parameters, or may be a feature graph which is pre-collected and stored in different periods of time in the same process flow, has the same target yield problem and contains various measurement parameters, or of course, may be ta feature graph which is obtained in other modes, has the same target yield problem and contains various measurement parameters. The exemplary embodiment does not impose the specific limitation on this.

The target yield problem stacked graph may refer to a graph which is obtained by stacking the target yield problem distribution graphs, each corresponding to a respective one of the wafers in the wafer list, and contains a target yield problem distribution feature. A graph feature corresponding to the target yield problem is obtained by superposing the target yield problem distribution graphs with the target yield problem, so that graph feature matching may be automatically performed on the target yield problem stacked graph.

In one exemplary embodiment of the disclosure, the measurement data stacked graph may also be generated by the following steps.

A measurement data set of each wafer in the wafer list under the different types of tests is obtained.

The measurement data distribution graphs corresponding to the different types of tests are generated based on the measurement data set.

The measurement data distribution graphs are stacked to obtain the measurement data stacked graphs corresponding to the wafer list.

The measurement parameter may refer to a parameter corresponding to various process problems which may cause the target yield problem of the wafer list under the different types of tests. For example, the measurement parameter may be the defect parameter corresponding to the defect problem, or may be the electrical parameter corresponding to the electrical problem, or may be the structural parameter corresponding to the structural problem, or of course, may be other measurement parameters corresponding to various process problems which can cause the target yield problem of the wafer list. The exemplary embodiment does not impose the specific limitation on this.

The measurement data set may refer to a set of measurement data corresponding to the wafers in the wafer list under the different types of tests, the measurement data distribution graphs corresponding to each measurement parameter may be generated through the measurement data set, and then the measurement data distribution graphs corresponding to each measurement parameter are stacked to obtain a plurality of measurement data stacked graphs of the wafer list under the different types of tests.

For instance, there are many types of yield tests for the wafer list, for example, a DC test, a function test, an AC test, and the like. The DC test verifies a voltage and current parameter. The function test verifies the correctness of a series of logic function operations inside the chip, and the like. Under these categories, there are also a number of subtypes of the yield, generally expressed Bins. Different Bins represent different test types, for example, a die with direct current (DC) parameter test fail may be marked by employing a symbol, such as "!", "@", "#", "$", "%", "&", "[", "+", and the like. The die with complete read-write function fail may be marked by employing the symbol, such as "a", "F", and the like. The die and the like with margin fail having a relatively slow read-write speed function may be marked by employing the symbol "X", "Y", "s", and the like. Of course, this is only illustrative. Serial numbers are different due to the use difference of semiconductor manufacturers. The specific limitation should not be imposed on the exemplary embodiment. In addition to the Bin, there is also Fail Shape Analysis (FSA), which also has a corresponding test item serial number, that is, different Bins or different FSAs represent different fail causes. In yield testing, in general, one wafer will get one map graph. The map graph reflects the fail situation of each die.

The disclosure aims to correlate the yield problem with the process problem corresponding to the wafer list when the wafer yield problem graph is obtained, and the process problem is reflected by the measurement data. Various measurements are performed after each process flow is completed. The measurement data reflects the quality of the process. In each measurement procedure, a corresponding map graph is obtained. However, there are many process problems causing the yield problem. The technical purpose of the disclosure is to find a certain measurement graph which has the greatest influence on the yield problem of the wafer list through the graph matching and graph correlation judgment, then the measurement graph locates the process that is most correlative to the yield problem of the wafer list, and then the process step is adjusted to improve the yield of the wafer and improve the product quality.

In S120, the graph matching is performed on the target yield problem stacked graph and each of the measurement data stacked graphs to obtain the matching degree data corresponding to the target yield problem stacked graph and each of the measurement data stacked graphs.

In one exemplary embodiment of the disclosure, the matching degree data may refer to data characterizing the matching degree of the graph feature in the measurement data stacked graph and the target yield problem stacked graph. For example, the matching degree data (between 0.0-1.0 or between 0% and 100%) may be 0.1 or 10%, may also be 0.9 or 90%, and of course, may also be other data capable of characterizing the matching degree of the graph feature in the measurement data stacked graph and the target yield problem stacked graph. The exemplary embodiment does not impose the specific limitation on this.

Specifically, a target measurement data stacked graph corresponding to an input measurement parameter under the different types of tests may be determined in the measurement data stacked graph, and then the graph matching is performed on the target yield problem stacked graph and the target measurement data stacked graph corresponding to the measurement parameter.

The target measurement data stacked graph may refer to the measurement data stacked graph corresponding to the input measurement parameter in the measurement data stacked graph. The measurement data distribution graphs corresponding to the wafer list under the measurement parameter are stacked based on the input measurement parameter under the different types of tests to obtain the measurement data stacked graph, and then the graph matching is performed on the target measurement data stacked graph corresponding to the measurement parameter and the target yield problem stacked graph.

In one exemplary embodiment of the disclosure, S120 may include S310 to S330. The matching degree data may be calculated through the S310 to S330.

Figure 3:
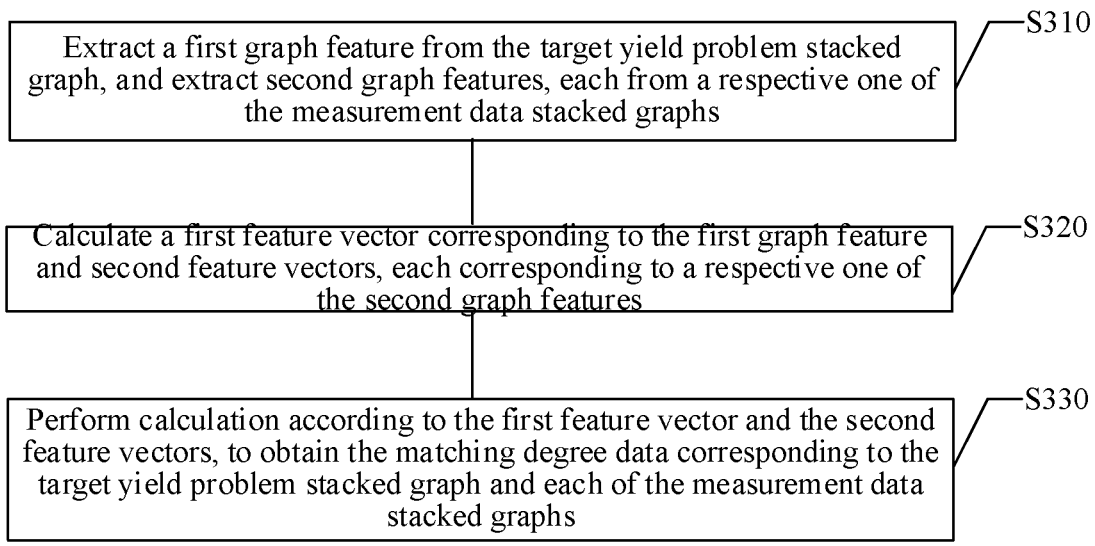
FIG. 3 schematically shows a flow chart of calculating matching degree data according to one embodiment of the disclosure.

Referring to FIG. 3, S310, a first graph feature is extracted from the target yield problem stacked graph, and a second graph feature is extracted from each of the measurement data stacked graphs.

S320, a first feature vector corresponding to the first graph feature and a second feature vector corresponding to the second graph feature are calculated.

S330, calculation is performed according to the first feature vector and the second feature vector to obtain the matching degree data corresponding to the target yield problem stacked graph and each of the measurement data stacked graphs.

The first graph feature may be the graph feature corresponding to target yield problem distribution in the target yield problem stacked graph. The second graph feature may be the graph feature corresponding to different measurement parameter distributions in the measurement data stacked graph. For example, the first graph feature in the target yield problem stacked graph and the second graph feature in the measurement data stacked graph corresponding to each measurement parameter may be extracted through a pre-established convolutional neural network model. The first graph feature in the target yield problem stacked graph and the second graph feature in the measurement data stacked graph may also be extracted through a scale-invariant feature transform (SIFT) algorithm. The first graph feature in the target yield problem stacked graph and the second graph feature in the target measurement data stacked graph may also be extracted through a Histogram of oriented gradient (HOG) algorithm. Of course, there may be other modes capable of extracting the graph feature. The exemplary embodiment does not impose the specific limitation on this.

After the first graph feature in the target yield problem stacked graph and the second graph feature in the target measurement data stacked graph are extracted, the first feature vector corresponding to the first graph feature and the second feature vector corresponding to the second graph feature may be calculated, and then the matching degree data of the target yield problem stacked graph and the measurement data stacked graph are determined according to the first feature vector and the second feature vector.

It is to be noted that "first" and "second" in the exemplary embodiment are only used to distinguish different graph features and the feature vectors corresponding to the different graph features and have no specific meaning herein, and the specific limitation should not be imposed on the exemplary embodiment.

Further, the matching degree data may be calculated based on the feature vector through the following steps.

Similarity data of the first feature vector and the second feature vector is calculated.

The similarity data is taken as the matching degree data corresponding to the target yield problem stacked graph and each of the measurement data stacked graphs.

The similarity data may refer to data characterizing the first feature vector and the second feature vector. For example, the similarity data may be cosine similarity data corresponding to the first feature vector and the second feature vector, may also be a Pearson correlation coefficient corresponding to the first feature vector and the second feature vector, may also be the Euclidean distance corresponding to the first feature vector and the second feature vector, and of course, may also be other data capable of characterizing the first feature vector and the second feature vector. The exemplary embodiment does not impose the specific limitation on this.

Since the first feature vector is a feature vector corresponding to the graph feature of the target yield problem distribution of the target yield problem stacked graph, and the second feature vectors are graph features of different measurement parameter distributions in the measurement data stacked graphs, the similarity data of the first feature vector and the second feature vectors may be taken as data representing the matching degree of the target yield problem stacked graph and each of the measurement data stacked graphs.

Of course, the matching degree data of the target yield problem stacked graph and each of the measurement data stacked graphs may also be obtained in other modes. For example, the matching degree data of the target yield problem stacked graph and each of the target measurement data stacked graphs may be determined through a trained depth learning model or a random forest model, and the exemplary embodiment is not limited to this.

In S130, the correlation data corresponding to each of the measurement data stacked graphs and the target yield problem stacked graph is calculated.

In one exemplary embodiment of the disclosure, the correlation data may refer to quantity capable of characterizing the correlation degree between each of the measurement data stacked graphs and the target yield problem stacked graph. For example, the wafer yield in the main graph region in the target yield problem stacked graph may be taken as a horizontal axis of a correlation coordinate system, an average value of the measurement parameter corresponding to the wafers in the main graph region in the measurement data stacked graph may be taken as a longitudinal axis of the correlation coordinate system, and the correlation data of the measurement data stacked graph and the target yield problem stacked graph is calculated according to an obtained curve in the correlation coordinate system. Of course, there may be other modes capable of characterizing the correlation data between the measurement data stacked graph and the target yield problem stacked graph, and the exemplary embodiment does not impose the specific limitation on this.

Specifically, the S130 may include the S410 and S420, and before the correlation data is calculated, graph partitioning may be performed on the measurement data stacked graph and the target yield problem stacked graph through S410 to S420.

Figure 4:
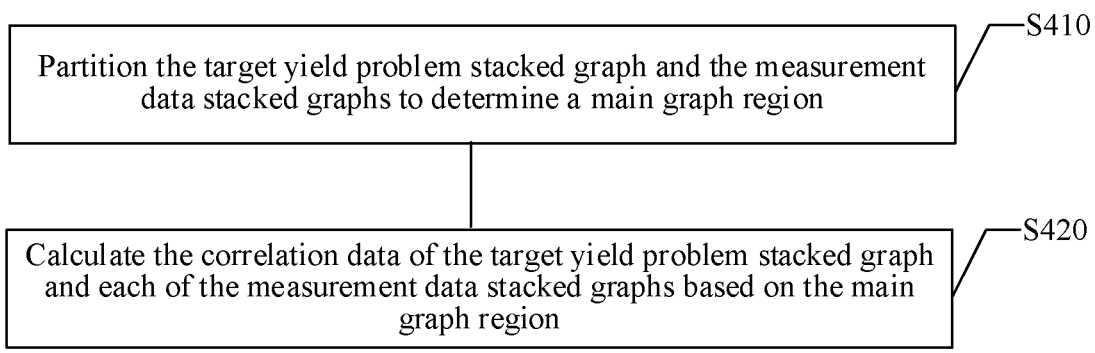
FIG. 4 schematically shows a flow chart of calculating correlation data according to one embodiment of the disclosure.

Referring to FIG. 4, in S410, the target yield problem stacked graph and the measurement data stacked graphs are partitioned to determine a main graph region.

In S420, the correlation data of the target yield problem stacked graph and each of the measurement data stacked graphs is calculated based on the main graph region.

Partitioning may refer to a processing procedure of performing region partitioning according to a graph feature distribution situation in the target yield problem stacked graph or the measurement data stacked graphs. For example, the target yield problem stacked graph or the measurement data stacked graphs may be partitioned according to the graph region (for example, 10*10 graph region) of a fixed size. The target yield problem stacked graph or the measurement data stacked graphs may also be partitioned according to the density of the graph feature distribution. The whole target yield problem stacked graph or measurement data stacked graphs may be selected for partitioning. Specifically, the partitioning is performed according to the graph feature distribution situation of the target yield problem stacked graph or the measurement data stacked graphs in the actual situation. The exemplary embodiment does not impose the specific limitation on this. The main graph region may refer to a main feature distribution region formed after partitioning the target yield problem stacked graph or the measurement data stacked graphs. Preferably, the main graph region in the target yield problem stacked graph may correspond to the main graph region in the measurement data stacked graphs (for example, the shape of the graph region shape, the position of the graph region, the size of the graph region, and the like).

Preferably, the correlation data corresponding to the measurement data stacked graphs and the target yield problem stacked graph may be calculated through the following steps that: wafer yield data corresponding to the main graph region in the target yield problem stacked graph may be determined; statistical feature data of the measurement parameter corresponding to the main graph region in each of the measurement data stacked graphs is determined; and the correlation data of the target yield problem stacked graph and each of the measurement data stacked graphs is calculated through the wafer yield data and the statistical feature data in the main graph region.

For instance, assuming that the graph feature of the target yield problem stacked graph is primarily concentrated within a certain graph region (that is, the main graph region), the main graph region has a total of 100 dies in which 10 dies fail, and then the yield of the graph region is 90%. Therefore, a yield value corresponding to the graph region may be taken as an ordinate of a correlation curve, then the average value of a WAT A value in the measurement data stacked graph corresponding to a WAT A parameter (that is, the measurement parameter is the WAT A parameter) of the selected 100 dies is taken as an abscissa of the correlation curve, and then the correlation data of the measurement data stacked graphs and the target yield problem stacked graph is determined according to the constructed correlation curve.

In S140, the weighted calculation is performed on the matching degree data and the correlation data, and the target measurement parameter causing the target yield problem is determined according to the result of the weighted calculation.

In one exemplary embodiment of the disclosure, the target measurement parameter may refer to the parameter which is obtained through analysis and causes the target yield problem in the target yield problem stacked graph. For example, assuming that the result of the weighted calculation of the target yield problem stacked graph and the measurement data stacked graph corresponding to the WAT A parameter is relatively high, it is considered that the target yield problem stacked graph is matched with the WAT A parameter well, and at this time, the WAT A parameter may be regarded as the target measurement parameter causing the target yield problem of the target yield problem stacked graph.

Specifically, the measurement data stacked graph corresponding to each measurement parameter may be sequenced according to the result of the weighted calculation, the measurement data stacked graph corresponding to the largest weighted calculation result is determined as the most correlative measurement data stacked graph, and the measurement parameter corresponding to the most correlative measurement data stacked graph is taken as the target measurement parameter causing the target yield problem.

Preferably, in some cases, the matching degree data or the correlation data is relatively high, but a final weighted calculation result is relatively low, at this time, this does not represent that the target yield problem is unrelated to the measurement parameter. In order to further ensure the accuracy of the obtained target measurement parameter, the most correlative measurement parameter may be jointly determined by combining the matching degree data, the correlation data, and the result of the weighted calculation.

The measurement data stacked graph having the highest matching degree and the measurement data stacked graph having the highest correlation with the target yield problem stacked graph may be respectively determined according to the matching degree data and the correlation data, then the highest matching degree measurement parameter and the highest correlation measurement parameter corresponding to the target yield problem stacked graph are determined based on the measurement data stacked graph having the highest matching degree and the measurement data stacked graph having the highest correlation, and then a rationality judgment flow is executed on the highest matching degree measurement parameter, the highest correlation measurement parameter, the target measurement parameter, and the target yield problem so as to determine the measurement parameter most correlative to the target yield problem according to a rationality judgment result.

The measurement data stacked graph having the highest matching degree may refer to the measurement data stacked graph corresponding to the largest matching degree data after the matching degree data is sequenced, and the measurement parameter corresponding to the measurement data stacked graph having the highest matching degree is the highest matching degree measurement parameter. The measurement data stacked graph having the highest correlation may refer to the measurement data stacked graph corresponding to the largest correlation data after the correlation data is sequenced, and the measurement parameter corresponding to the measurement data stacked graph having the highest correlation is the highest correlation measurement parameter.

The rationality judgment flow may refer to preset judgment of the highest matching degree measurement parameter (the measurement parameter corresponding to the measurement data stacked graph having the highest matching degree), the highest correlation measurement parameter (the measurement parameter corresponding to the measurement data stacked graph having the highest correlation) and the target measurement parameter (the measurement parameter of the most correlative measurement data stacked graph corresponding to the largest weighted calculation result), when numerical values of the matching degree data, the correlation data, and the result of the weighted calculation differ greatly.

For example, when a difference value among the matching degree data, the correlation data, and the result of the weighted calculation is detected to be greater than a preset difference value threshold value, the determined highest matching degree measurement parameter, the highest correlation measurement parameter, and the target measurement parameter may be sent to a management control terminal, so that a correlative manager of the management control terminal further judges the most correlative measurement parameter causing the target yield problem in a manual mode. The result may also be further judged through a preset judgment condition. For example, when the matching degree data or the correlation data is greater than 90% and the result of the weighted calculation is less than 20%, the highest matching degree measurement parameter or the highest correlation measurement parameter corresponding to the matching degree data or the correlation data is taken as the final analysis result. Of course, only schematic illustration is performed herein, and the exemplary embodiment does not impose the specific limitation on this.

In one exemplary embodiment of the disclosure, the weighted calculation may be performed on the matching degree data and the correlation data through a pre-selected target weighted calculation mode. The target weighted calculation mode may refer to a weighted calculation mode determined according to experimental data in advance, in which result of the weighted calculation can correctly reflect the analysis result.

Figure 5:
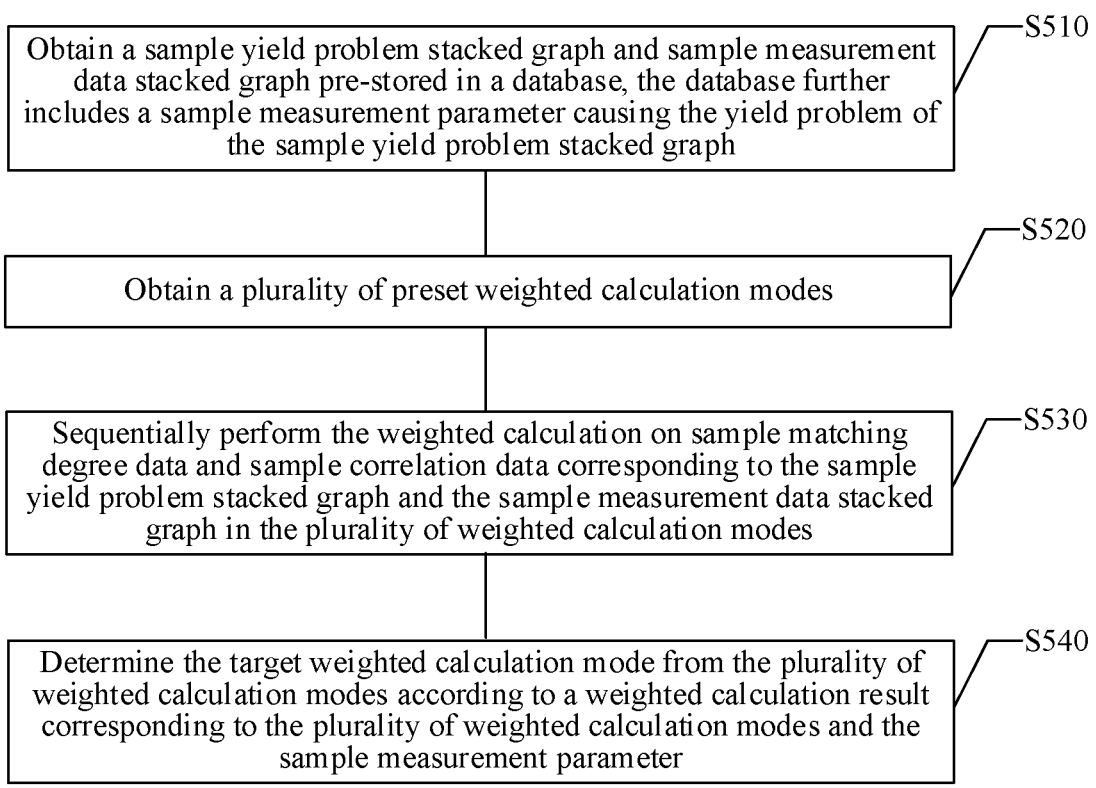
FIG. 5 schematically shows a flow chart of determining a target weighted calculation mode according to one embodiment of the disclosure.

Specifically, before the weighted calculation is performed on the matching degree data and the correlation data, the target weighted calculation mode may be determined through the steps in FIG. 5.

Referring to FIG. 5, S510, a sample yield problem stacked graph and sample measurement data stacked graphs pre-stored in a database are obtained, the database further includes a sample measurement parameter causing the yield problem of the sample yield problem stacked graph.

S520, a plurality of preset weighted calculation modes are obtained.

S530, the weighted calculation is sequentially performed on sample matching degree data and sample correlation data corresponding to the sample yield problem stacked graph and the sample measurement data stacked graphs in the plurality of weighted calculation modes.

S540, the target weighted calculation mode is determined from the plurality of weighted calculation modes according to result of the weighted calculation corresponding to the plurality of weighted calculation modes and the sample measurement parameters.

The sample target yield problem stacked graph and the sample measurement data stacked graphs may refer to sample data used for testing in a pre-established standard database, and at this time, the sample target yield problem stacked graph and the sample measurement data stacked graphs may be in one hundred percent correspondence. Then the weighted calculation is performed on the matching degree data and the correlation data corresponding to the sample target yield problem stacked graph and the sample measurement data stacked graph by employing the above method. If the result of the weighted calculation is 80%, this indicates that the corresponding weighted calculation mode is relatively poor, other weighted calculation modes may be selected for recalculation until the result of the weighted calculation is infinitely close to 100%, and finally, the weighted calculation mode with the highest weighted calculation result is taken as the target weighted calculation mode.

The plurality of weighted calculation modes may include the weighted calculation mode for multiplying the matching degree data with the correlation data, or the weighted calculation mode for respectively weighting the matching degree data and the correlation data and then performing an adding operation. The specific weighted calculation mode may be optimally constructed by continuously changing different mathematical formulas in an experimental procedure, so that the exemplary embodiment does not impose the specific limitation on the plurality of weighted calculation modes.

A target weighted calculation mode is selected from the plurality of weighted calculation modes through the sample target yield problem stacked graph and the sample measurement data stacked graphs in the pre-established standard database. The accuracy of the result of the weighted calculation of the matching degree data and the correlation data corresponding to the target yield problem stacked graph and the measurement data stacked graphs is further improved. The accuracy of the target measurement parameter is improved. The process flow causing the target yield problem is determined based on the obtained target measurement parameter, and the wafer yield is improved.

FIG. 6 schematically shows an application schematic diagram of determining a target measurement parameter according to one embodiment of the disclosure.

Referring to FIG. 6, in S610, an input wafer list and target yield problem distribution graphs (for example, Lot A, wafer B, Lot C, Lot D, wafer E, and the like), each corresponding to a respective one of wafer in the wafer list are obtained, and input measurement parameters under different types of tests are obtained.

In S620, the target yield problem distribution graphs are stacked to obtain the target yield problem stacked graph, and stacking is performed based on the measurement data distribution graphs under the different types of tests to obtain the measurement data stacked graphs. Specifically, the target yield problem distribution graphs are stacked based on the input measurement parameters under the different types of tests to obtain the target yield problem stacked graph 601 of the target yield problem distribution feature. For example, the target yield problem stacked graph 601 may include a fail wafer region 602 and a qualified wafer region except for the fail wafer region 602 in the target yield problem stacked graph 601. Of course, the target yield problem stacked graph 601 is only a schematic diagram and any specific limitation should not be imposed on the exemplary embodiment.

In S630, the match degree data and the correlation data are calculated. Specifically, the feature matching is performed on the image feature in the target yield problem stacked graph 601 and the measurement data stacked graphs under the different types of tests (for example, the stacked graph corresponding to the wafer list under the MET A measurement parameter, the stacked graph corresponding to the wafer list under the MET B measurement parameter, the stacked graph corresponding to the wafer list under the WAT A measurement parameter, the stacked graph corresponding to the wafer list under the WAT B measurement parameter, the stacked graph corresponding to the wafer list under the Defect A measurement parameter, the stacked graph corresponding to the wafer list under the Defect B measurement parameter, and the like) to obtain the matching degree data, and construct the correlation curve to obtain the correlation data.

In S640, a weighted score is calculated. Specifically, the weighted calculation is performed on the obtained matching degree data and the correlation data to obtain the weighted scores (the result of the weighted calculation), and finally, the target measurement parameter is determined based on the weighted scores, or the most correlative measurement parameter causing the target yield problem stacked graph 601 is determined according to the weighted scores, the target measurement parameter corresponding to the matching degree data and the correlation data, and the rationality of the highest matching degree measurement parameter and the highest correlation measurement parameter, and finally, visual presentation of the analysis result (and an analysis procedure) may be performed.

It is to be noted that although the various steps of the method of the disclosure have been described in a specific sequence in the drawings, but this does not require or imply that the steps must be performed in the specific sequence, or that all illustrated steps must be performed in order to achieve the desired result. Additionally or alternatively, certain steps may be omitted, a plurality of steps may be combined into one step for execution, and/or one step may be broken into a plurality of steps for execution, and the like.

Figure 7:
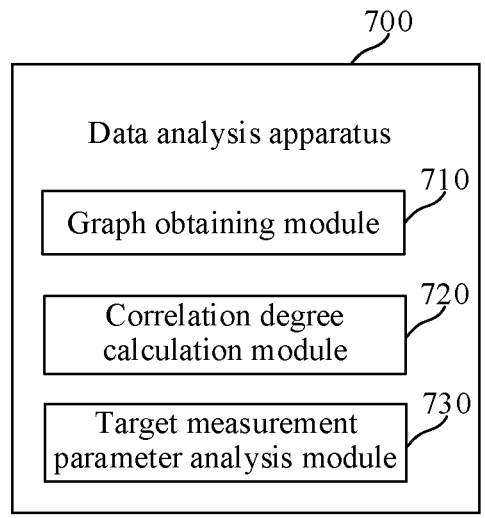
FIG. 7 schematically shows a schematic diagram of a data analysis apparatus according to one embodiment of the disclosure.

In addition, in the exemplary embodiment, a data analysis apparatus is further provided. Referring to FIG. 7, the data analysis apparatus 700 includes: a graph obtaining module 710, a correlation degree calculation module 720, and a target measurement parameter analysis module 730.

The graph obtaining module 710 is configured to obtain a target yield problem stacked graph corresponding to a wafer list having a target yield problem and to obtain measurement data stacked graphs of the wafer list under different types of tests.

The correlation degree calculation module 720 is configured to calculate matching degree data and correlation data corresponding to the target yield problem stacked graph and each of the measurement data stacked graphs and to perform weighted calculation on the matching degree data and the correlation data to obtain result of the weighted calculation.

The target measurement parameter analysis module 730 is configured to analyze the result of the weighted calculation to determine a target measurement parameter causing the target yield problem.

In one exemplary embodiment of the disclosure, based on the foregoing solution, the correlation degree calculation module 720 further includes: a matching degree data calculation unit and a correlation degree data calculation unit.

The matching degree data calculation unit is configured to perform graph matching on the target yield problem stacked graph and each of the measurement data stacked graphs to obtain matching degree data corresponding to the target yield problem stacked graph and each of the measurement data stacked graphs.

The correlation degree data calculation unit is configured to calculate correlation data corresponding to each of the measurement data stacked graphs and the target yield problem stacked graph.

In one exemplary embodiment of the disclosure, based on the foregoing solution, the correlation data calculation unit further includes: a graph partitioning sub-unit, a wafer yield determining sub-unit, a statistical feature determining sub-unit, and a correlation data calculation sub-unit.

The graph partitioning sub-unit is configured to partition the target yield problem stacked graph and the measurement data stacked graphs to determine a main graph region.

The wafer yield determining sub-unit is configured to determine wafer yield data corresponding to the main graph region in the target yield problem stacked graph.

The statistical feature determining sub-unit is configured to determine statistical feature data of the measurement parameter corresponding to the main graph region in each of the measurement data stacked graphs.

The correlation data calculation sub-unit is configured to calculate correlation data of each of the measurement data stacked graphs and the target yield problem stacked graph through the wafer yield data and the statistical feature data in the main graph region.

In one exemplary embodiment of the disclosure, the graph obtaining module 710 further includes a target yield problem stacked graph obtaining unit. The target yield problem stacked graph obtaining unit is configured to perform the following operations.

The wafer list having the target yield problem is obtained, each wafer in the wafer list has a target yield problem distribution graph.

The target yield problem distribution graphs, each corresponding to a respective one of the wafers, are stacked to obtain the target yield problem stacked graph.

In one exemplary embodiment of the disclosure, the graph obtaining module 710 further includes a measurement data stacked graph obtaining unit. The measurement data stacked graph obtaining unit is configured to perform the following operations.

A measurement data set of each wafer in the wafer list under the different types of tests is obtained.

The measurement data distribution graphs corresponding to the different types of tests are generated based on the measurement data set.

The measurement data distribution graphs are stacked to obtain the measurement data stacked graphs corresponding to the wafer list.

In one exemplary embodiment of the disclosure, based on the foregoing solution, the matching degree data calculation unit further includes: a graph feature extraction sub-unit, a feature vector calculation sub-unit, and a matching degree calculation sub-unit.

The graph feature extraction sub-unit is configured to extract a first graph feature from the target yield problem stacked graph, and extracting second graph features, each from a respective one of the measurement data stacked graphs.

The feature vector calculation sub-unit is configured to calculate a first feature vector corresponding to the first graph feature and second feature vectors, each corresponding to a respective one of the second graph features.

The matching degree calculation sub-unit is configured to perform calculation according to the first feature vector and each of the second feature vector to obtain the matching degree data corresponding to the target yield problem stacked graph and each of the measurement data stacked graphs.

In one exemplary embodiment of the disclosure, based on the foregoing solution, the matching degree calculation sub-unit is further configured to perform the following operations.

Similarity data of the first feature vector and each of the second feature vectors is calculated.

The similarity data is taken as the matching degree data corresponding to the target yield problem stacked graph and each of the measurement data stacked graphs.

In one exemplary embodiment of the disclosure, based on the foregoing solution, the target measurement parameter analysis module 730 further includes a first analysis unit. The first analysis unit is configured to perform the following operations.

The measurement data stacked graphs are sequenced according to the result of the weighted calculation, and the measurement data stacked graph corresponding to the largest weighted calculation result is determined as the most correlative measurement data stacked graph.

The measurement parameter corresponding to the most correlative measurement data stacked graph is taken as the target measurement parameter causing the target yield problem.

In one exemplary embodiment of the disclosure, based on the foregoing solution, the target measurement parameter analysis module 730 further includes a second analysis unit. The second analysis unit is configured to perform the following operations.

The measurement data stacked graph having the highest matching degree with the target yield problem stacked graph is determined according to the matching degree data, and the measurement data stacked graph having the highest correlation with the target yield problem stacked graph is determined according to the correlation data.

The highest matching degree measurement parameter and the highest correlation measurement parameter corresponding to the target yield problem stacked graph are determined based on the measurement data stacked graph having the highest matching degree and the measurement data stacked graph having the highest correlation.

A rationality judgment flow is performed on the highest matching degree measurement parameter, the highest correlation measurement parameter, the target measurement parameter, and the target yield problem so as to determine the measurement parameter most correlative to the target yield problem according to a rationality judgment result.

In one exemplary embodiment of the disclosure, based on the foregoing solution, the data analysis apparatus further includes a weighted calculation mode screening unit. The weighted calculation mode screening unit is configured to perform the following operations.

A sample yield problem stacked graph and sample measurement data stacked graphs pre-stored in a database are obtained, and the database further includes a sample measurement parameter causing the yield problem of the sample yield problem stacked graph.

A plurality of preset weighted calculation modes are obtained.

The weighted calculation is sequentially performed on sample matching degree data and sample correlation data corresponding to the sample yield problem stacked graph and the sample measurement data stacked graphs in the plurality of weighted calculation modes.

The target weighted calculation mode is determined from the plurality of weighted calculation modes according to result of the weighted calculation corresponding to the plurality of weighted calculation modes and the sample measurement parameters.

In one exemplary embodiment of the disclosure, based on the foregoing solution, the measurement parameters include one or more combinations of a defect parameter, an electrical parameter, and a structural parameter.

The specific details of each module in the above data analysis apparatus have been described in detail in the corresponding data analysis method, and thus will not be described in detail herein.

It is to be noted that although in the above detailed description, reference has been made to a number of modules or units of the data analysis apparatus, such division is not mandatory. Indeed, according to the implementation mode of the disclosure, the features and functions of two or more modules or units described above may be embodied in one module or unit. On the contrary, the features and functions of one module or unit described above may further be divided to be embodied by a plurality of modules or units.

In addition, in the exemplary embodiment of the disclosure, an electronic device capable of implementing the above data analysis method is further provided.

Those skilled in the art will appreciate that various aspects of the disclosure may be implemented as a system, method, or program product. Therefore, various aspects of the disclosure may be embodied in the form of: an entire hardware embodiment, an entire software embodiment (including firmware, microcode, and the like), or an embodiment combining hardware and software aspects, which may be collectively called a "circuit", "module", or "system" herein.

Hereinafter, the electronic device 800 of the embodiment of the disclosure will be described with reference to FIG. 8. The electronic device 800 shown in FIG. 8 is only an example and any limitation should not be imposed on the function and use scope of the embodiment of the disclosure.

Figure 8:
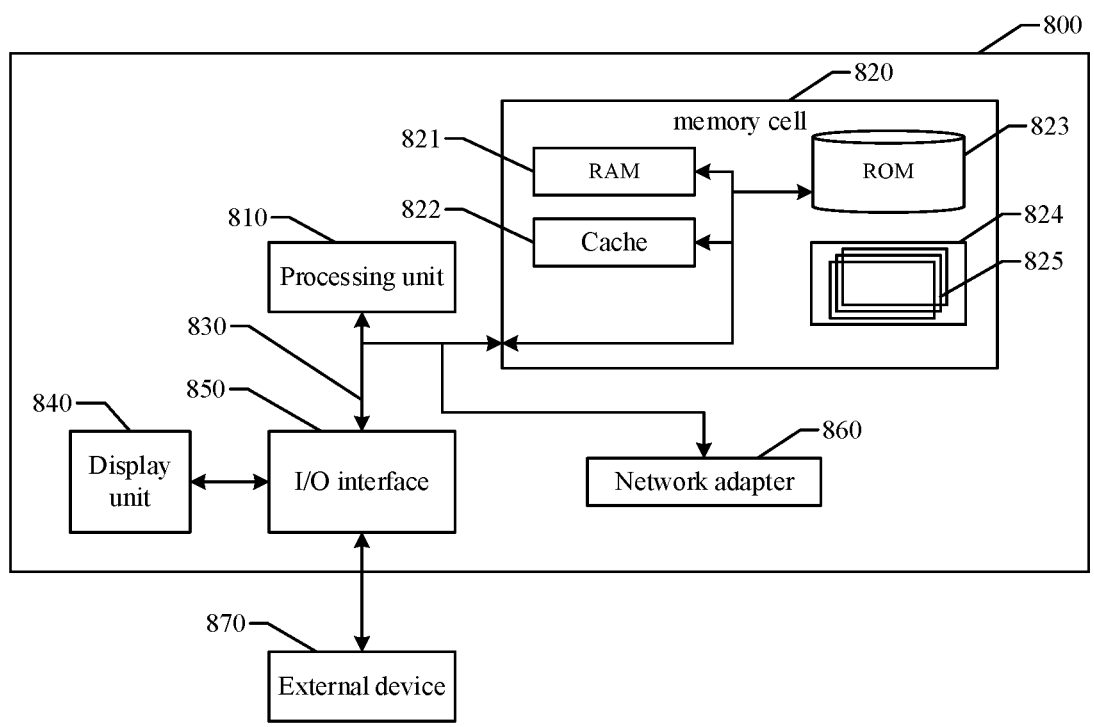
FIG. 8 schematically shows a structural schematic diagram of a computer system of an electronic device according to one embodiment of the disclosure.

As shown in FIG. 8, the electronic device 800 is expressed in the form of a general purpose computing device. Components of the electronic device 800 may include, but are not limited to: the at least one processing unit 810, the at least one storage unit 820, a bus 830 connecting different system components (including the storage unit 820 and the processing unit 810), and a display unit 840.

The storage unit stores a program code. The program code may be executed by the processing unit 810, so that the processing unit 810 performs the steps according to various exemplary embodiments of the disclosure described in the above "exemplary method" section of the specification. For example, the processing unit 810 may execute, as shown in FIG. 1, in S110, a target yield problem stacked graph corresponding to a wafer list having a target yield problem is obtained, and measurement data stacked graphs of the wafer list under different types of tests are obtained; in S120, graph matching is performed on the target yield problem stacked graph and each of the measurement data stacked graphs to obtain matching degree data corresponding to the target yield problem stacked graph and each of the measurement data stacked graphs; in S130, correlation data corresponding to each of the measurement data stacked graphs and the target yield problem stacked graph is calculated; and in S140, weighted calculation is performed on the matching degree data and the correlation data, and a target measurement parameter causing the target yield problem is determined according to result of the weighted calculation.

The storage unit 820 may include a readable medium in the form of a volatile storage unit, for example, a Random Access Memory (RAM) 821 and/or a cache storage unit 822, and may further include a Read-Only Memory (ROM) 823.

The storage unit 820 may further include a program/utility 824 having a set (at least one) of program modules 825. Such program module 825 includes, but is not limited to: an operating system, one or more applications, other program modules, and program data. Each or a certain combination of these examples may include the implementation of a network environment.

The bus 830 may be expressed as one or more of several types of bus structures, including a storage unit bus or a storage unit controller, a peripheral bus, an accelerated graphics port, a processing unit, or a local bus using any bus structure in a plurality of bus structures.

The electronic device 800 may also communicate with one or more peripheral devices 870 (for example, a keyboard, a pointing device, a Bluetooth device, and the like), may also communicate with one or more devices that enable a user to interact with the electronic device 800, and/or may communicate with any device (for example, a router, a modem, and the like) that enables the electronic device 800 to communicate with one or more other computing devices. Such communication may be performed through the input/output (I/O) interface 850. Furthermore, the electronic device 800 may also communicate with one or more networks (for example, a Local Area Network (LAN), a Wide Area Network (WAN), and/or a public network, for example, the Internet) through a network adapter 860. As shown in figures, the network adapter 860 communicates with other modules of the electronic device 800 through the bus 830. It is to be understood that although not shown in the drawings, the electronic device 800 may be used with other hardware and/or software modules, including but not limited to: a microcode, a device driver, a redundant processing unit, an external disk drive array, a RAID system, a tape driver, and a data backup storage system.

From the above description of the embodiment, those skilled in the art are easy to understand that the exemplary embodiment described herein may be implemented through software or may also be implemented through the software in combination with necessary hardware. Therefore, the technical solution according to the embodiment of the disclosure may be embodied in the form of a software product. The software product may be stored in a non-volatile storage medium (which may be a CD-ROM, a U-disk, a mobile hard disk, and the like) or on a network, and may include a number of instructions, so that a computing device (which may be a personal computer, a server, a terminal device, or a network device, and the like) executes the method according to the embodiment of the disclosure.

In the exemplary embodiment of the disclosure, a computer-readable storage medium is further provided, and a program product capable of implementing the above method in the specification is stored on the computer-readable storage medium. In some possible embodiments, various aspects of the disclosure may also be implemented in the form of a program product, including a program code. When the program product is run on the terminal device, the program code is configured to enable the terminal device to perform the steps according to various exemplary embodiments of the disclosure described in the above "exemplary method" section of the specification.

Figure 9:
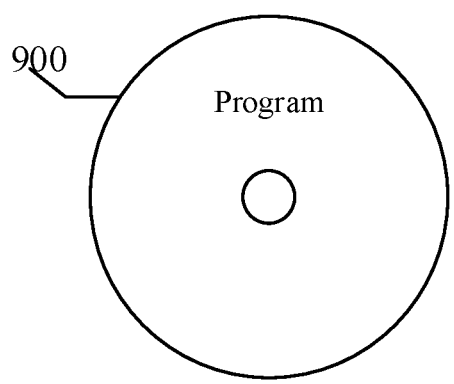
FIG. 9 schematically shows a schematic diagram of a computer-readable storage medium according to one embodiment of the disclosure.

Referring to FIG. 9, the program product 900 for implementing the above data analysis method according to the embodiment of the disclosure is described. The program product 900 may employ a portable Compact Disc Read-Only Memory (CD-ROM) and includes a program code, and may be run on the terminal device, for example, a personal computer. However, the program product of the disclosure is not limited herein, and in the document, the readable storage medium may be any tangible medium that contains or stores a program. The program may be used by or in combination with an instruction execution system, apparatus, or device.

The program product may employ any combination of one or more readable media. The readable medium may be a readable signal medium or a readable storage medium. For example, the readable storage medium may be, but is not limited to, an electrical, magnetic, optical, electromagnetic, infrared, or semiconductor system, apparatus, or device, or any combination thereof. More specific examples (a non-exhaustive list) of the readable storage medium include: an electrical connection having one or more wires, a portable disk, a hard disk, a Random Access Memory (RAM), a Read-Only Memory (ROM), an Erasable Programmable Read-Only Memory (EPROM or Flash memory), an optical fiber, a portable Compact Disk Read-Only Memory (CD-ROM), an optical storage device, a magnetic storage device, or any suitable combination thereof.

The computer-readable signal medium may include a data signal propagating in baseband or as part of a carrier wave. The data signal carries a readable program code. Such propagated data signal may be in various forms, including but not limited to an electromagnetic signal, an optical signal, or any suitable combination thereof. The readable signal medium may also be any readable medium in addition to the readable storage medium. The readable medium may send, propagate, or transmit the program used by or in combination with the instruction execution system, apparatus, or device.

The program code contained on the readable medium may be transmitted through any suitable medium including, but not limited to, wireless, wired, fiber optic, RF, and the like, or any suitable combination thereof.

The program code for performing an operation of the disclosure may be written in any combination of one or more programming languages. The programming language includes an object-oriented programming language such as Java, C++, and the like, as well as a conventional procedural programming language such as a "C" language or a similar programming language. The program code may be executed entirely on a user computing device, partially on a user device, as a stand-alone software package, partially on a user computing device, partially on a remote computing device, or entirely on a remote computing device or server. In the case of the remote computing device, the remote computing device may be connected with the user computing device through any kind of network, including a Local Area Network (LAN) or a Wide Area Network (WAN), or may be connected with the external computing device (for example, connected through the Internet using an Internet service provider).

In addition, the above drawings are only schematic illustrations of the processing involved in the method according to the exemplary embodiment of the disclosure, and are not intended to limit. It is easy to understand that the processing shown in the above drawings do not indicate or limit the time sequence of the processing. Moreover, It is also easy to understand that the processing may be performed synchronously or asynchronously, for example, in a plurality of modules.

From the above description of the embodiment, those skilled in the art are easy to understand that the exemplary embodiment described herein may be implemented through software or may also be implemented through the software in combination with necessary hardware. Therefore, the technical solution according to the embodiment of the disclosure may be embodied in the form of a software product. The software product may be stored in a non-volatile storage medium (which may be a CD-ROM, a U-disk, a mobile hard disk, and the like) or on a network, and may include a number of instructions, so that a computing device (which may be a personal computer, a server, a touch terminal, or a network device, and the like) executes the method according to the embodiment of the disclosure.

Other embodiments of the disclosure will be apparent to those skilled in the art from consideration of the specification and practice of the disclosure disclosed herein. The present application is intended to cover any variations, uses, or adaptations of the disclosure, and the variations, uses, or adaptations follow the general principles of the disclosure and include common general knowledge or conventional technical means in the art undisclosed by the disclosure. The specification and embodiments are considered as examples only, and a true scope and spirit of the disclosure are indicated by the claims.

It will be appreciated that the disclosure is not limited to the exact structure that has been described above and illustrated in the accompanying drawings, and that various modifications and changes can be made without departing from the scope thereof. The scope of the disclosure is only limited by the appended claims.

What is claimed is:

1. A data analysis method, comprising:
obtaining a target yield problem stacked graph corresponding to a wafer list having a target yield problem, and obtaining measurement data stacked graphs of the wafer list under different types of tests;
performing graph matching on the target yield problem stacked graph and each of the measurement data stacked graphs to obtain matching degree data corresponding to the target yield problem stacked graph and each of the measurement data stacked graphs;
calculating correlation data corresponding to each of the measurement data stacked graphs and the target yield problem stacked graph; and
performing weighted calculation on the matching degree data and the correlation data, and determining a target measurement parameter causing the target yield problem according to a result of the weighted calculation;
wherein said obtaining measurement data stacked graphs of the wafer list under different types of tests comprises:
obtaining a measurement data set of each of wafers in the wafer list under the different types of tests;
generating the measurement data distribution graphs corresponding to the different types of tests based on the measurement data set; and
stacking the measurement data distribution graphs to obtain the measurement data stacked graphs corresponding to the wafer list to adjust a process manufacturing step to improve a yield of the wafer and improve a product quality.

2. The data analysis method of claim 1, wherein said obtaining the target yield problem stacked graph corresponding to the wafer list having the target yield problem comprises:
- obtaining the wafer list having the target yield problem, each of wafers in the wafer list having a respective one of target yield problem distribution graphs; and
- stacking the target yield problem distribution graphs, each corresponding to a respective one of the wafers, to obtain the target yield problem stacked graph.

3. The data analysis method of claim 1, wherein said performing graph matching on the target yield problem stacked graph and each of the measurement data stacked graphs to generate matching degree data corresponding to the target yield problem stacked graph and each of the measurement data stacked graphs comprises:
- extracting a first graph feature from the target yield problem stacked graph, and extracting second graph features, each from a respective one of the measurement data stacked graphs;
- calculating a first feature vector corresponding to the first graph feature, and second feature vectors, each corresponding to a respective one of the second graph features; and
- performing calculation according to the first feature vector and each of the second feature vectors, to obtain the matching degree data corresponding to the target yield problem stacked graph and each of the measurement data stacked graphs.

4. The data analysis method of claim 3, wherein said performing calculation according to the first feature vector and each of the second feature vectors to obtain the matching degree data corresponding to the target yield problem stacked graph and each of the measurement data stacked graphs comprises:
- calculating similarity data of the first feature vector and each of the second feature vectors; and
- taking the similarity data as the matching degree data corresponding to the target yield problem stacked graph and each of the measurement data stacked graphs.

5. The data analysis method of claim 1, wherein said calculating correlation data corresponding to each of the measurement data stacked graphs and the target yield problem stacked graph comprises:
- partitioning the target yield problem stacked graph and the measurement data stacked graphs to determine a main graph region; and
- calculating the correlation data of the target yield problem stacked graph and each of the measurement data stacked graphs based on the main graph region.

6. The data analysis method of claim 5, wherein said calculating the correlation data corresponding to each of the measurement data stacked graphs and the target yield problem stacked graph based on the main graph region comprises:
- determining wafer yield data corresponding to the main graph region in the target yield problem stacked graph;
- determining statistical feature data of measurement parameters, each measurement parameter corresponding to the main graph region in a respective one of the measurement data stacked graphs; and
- calculating the correlation data of the target yield problem stacked graph and each of the measurement data stacked graphs through the wafer yield data and the statistical feature data in the main graph region.

7. The data analysis method of claim 1, wherein said determining the target measurement parameter causing the target yield problem according to the result of the weighted calculation comprises:
- sequencing the measurement data stacked graphs according to the result of the weighted calculation, and taking one of measurement data stacked graphs corresponding to a largest one in the result of the weighted calculation as a most correlative measurement data stacked graph; and
- taking a measurement parameter corresponding to the most correlative measurement data stacked graph as the target measurement parameter causing the target yield problem.

8. The data analysis method of claim 7, wherein after obtaining the most correlative measurement data stacked graph and taking the measurement parameter corresponding to the most correlative measurement data stacked graph as the target measurement parameter, the method further comprises:
- determining a measurement data stacked graph having a highest matching degree with the target yield problem stacked graph according to the matching degree data, and determining a measurement data stacked graph having a highest correlation with the target yield problem stacked graph according to the correlation data;
- determining a highest matching degree measurement parameter corresponding to the target yield problem stacked graph based on the measurement data stacked graph having the highest matching degree, and determining a highest correlation measurement parameter corresponding to the target yield problem stacked graph based on the measurement data stacked graph having the highest correlation; and
- executing a rationality judgment flow on the highest matching degree measurement parameter, the highest correlation measurement parameter, the target measurement parameter, and the target yield problem, to determine the measurement parameter most correlative to the target yield problem according to a rationality judgment result.

9. The data analysis method according to claim 1, wherein said performing weighted calculation on the matching degree data and the correlation data comprises:
- performing the weighted calculation on the matching degree data and the correlation data in a pre-selected target weighted calculation mode.

10. The data analysis method according to claim 9, wherein prior to performing weighted calculation on the matching degree data and the correlation data, the method further comprises:
- obtaining a sample yield problem stacked graph and a sample measurement data stacked graph pre-stored in a database, the database further comprising a sample measurement parameter causing the yield problem of the sample yield problem stacked graph;
- obtaining a plurality of preset weighted calculation modes;
- sequentially performing the weighted calculation on sample matching degree data and sample correlation data corresponding to the sample yield problem stacked graph and the sample measurement data stacked graph in the plurality of weighted calculation modes; and
- determining the target weighted calculation mode from the plurality of weighted calculation modes according to a result of the weighted calculation corresponding to the plurality of weighted calculation modes and the sample measurement parameter.

11. The data analysis method of claim 1, wherein the measurement parameter comprises one or more combinations of a defect parameter, an electrical parameter, and a structural parameter.

12. An electronic device, comprising:
a processor; and
a memory, storing computer-readable instructions executable by the processor;
wherein the processor is configured to:
obtain a target yield problem stacked graph corresponding to a wafer list having a target yield problem and obtain measurement data stacked graphs of the wafer list under different types of tests;
calculate matching degree data and correlation data corresponding to the target yield problem stacked graph and each of the measurement data stacked graphs, and perform weighted calculation on the matching degree data and the correlation data to obtain a result of the weighted calculation; and
analyze the result of the weighted calculation to determine a target measurement parameter causing the target yield problem;
wherein the processor is further configured to:
obtain a measurement data set of each of wafers in the wafer list under the different types of tests;
generate the measurement data distribution graphs corresponding to the different types of tests based on the measurement data set; and
stack the measurement data distribution graphs to obtain the measurement data stacked graphs corresponding to the wafer list to adjust a process manufacturing step to improve a yield of the wafer and improve a product quality.

13. The electronic device according to claim 12, wherein the processor is further configured to:
perform graph matching on the target yield problem stacked graph and each of the measurement data stacked graphs to obtain matching degree data corresponding to the target yield problem stacked graph and each of the measurement data stacked graphs; and
calculate correlation data corresponding to each of the measurement data stacked graphs and the target yield problem stacked graph.

14. The electronic device according to claim 13, wherein the processor is further configured to:
partition the target yield problem stacked graph and the measurement data stacked graphs to determine a main graph region;
determine wafer yield data corresponding to the main graph region in the target yield problem stacked graph;
determine statistical feature data of the measurement parameter corresponding to the main graph region in each of the measurement data stacked graphs; and
calculate correlation data of the target yield problem stacked graph and each of the measurement data stacked graphs through the wafer yield data and the statistical feature data in the main graph region.

15. A non-transitory computer readable storage medium, storing computer-readable instructions, which when executed by a processor, cause the processor to implement a data analysis method, the method comprising:
obtaining a target yield problem stacked graph corresponding to a wafer list having a target yield problem, and obtaining measurement data stacked graphs of the wafer list under different types of tests;
calculating matching degree data and correlation data corresponding to the target yield problem stacked graph and each of the measurement data stacked graphs, and performing weighted calculation on the matching degree data and the correlation data to obtain a result of the weighted calculation; and
analyzing the result of the weighted calculation to determine a target measurement parameter causing the target yield problem;
wherein said obtaining measurement data stacked graphs of the wafer list under different types of tests comprises:
obtaining a measurement data set of each of wafers in the wafer list under the different types of tests;
generating the measurement data distribution graphs corresponding to the different types of tests based on the measurement data set; and
stacking the measurement data distribution graphs to obtain the measurement data stacked graphs corresponding to the wafer list to adjust a process manufacturing step to improve a yield of the wafer and improve a product quality.

16. The non-transitory computer readable storage medium according to claim 15, wherein the method further comprises:
performing graph matching on the target yield problem stacked graph and each of the measurement data stacked graphs to obtain matching degree data corresponding to the target yield problem stacked graph and each of the measurement data stacked graphs; and
calculating correlation data corresponding to each of the measurement data stacked graphs and the target yield problem stacked graph.

17. The non-transitory computer readable storage medium according to claim 16, wherein the method further comprises:
partitioning the target yield problem stacked graph and the measurement data stacked graphs to determine a main graph region;
determining wafer yield data corresponding to the main graph region in the target yield problem stacked graph;
determining statistical feature data of the measurement parameter corresponding to the main graph region in each of the measurement data stacked graphs; and
calculating correlation data of the target yield problem stacked graph and each of the measurement data stacked graphs through the wafer yield data and the statistical feature data in the main graph region.

\* \* \* \* \*